US012622291B2

(12) United States Patent
Xie

(10) Patent No.: US 12,622,291 B2
(45) Date of Patent: May 5, 2026

(54) FLEXIBLE DISPLAY MODULE AND ELECTRONIC DEVICE

(71) Applicant: VIVO MOBILE COMMUNICATION CO., LTD., Dongguan (CN)

(72) Inventor: Huafei Xie, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 470 days.

(21) Appl. No.: 18/231,773

(22) Filed: Aug. 8, 2023

(65) Prior Publication Data

US 2023/0387033 A1 Nov. 30, 2023

Related U.S. Application Data

(63) Continuation of application No. PCT/CN2022/075343, filed on Feb. 7, 2022.

(30) Foreign Application Priority Data

Feb. 9, 2021 (CN) .......................... 202110175261.7

(51) Int. Cl.
*H01L 29/18* (2006.01)
*H01L 23/538* (2006.01)
(Continued)

(52) U.S. Cl.
CPC ........ *H01L 23/5387* (2013.01); *H01L 25/167* (2013.01)

(58) Field of Classification Search
CPC ... G06F 1/1652; G06F 1/1641; H10K 77/111; H10K 59/122; G09F 9/301; G09F 9/33;
(Continued)

(56) References Cited

U.S. PATENT DOCUMENTS 12,336,358 B2 * 6/2025 Yamada .................... G09F 9/00
2014/0231763 A1 * 8/2014 Kim ...................... H10K 59/353
438/34
(Continued)

FOREIGN PATENT DOCUMENTS

CN 106098710 A 11/2016
CN 106200059 A 12/2016
(Continued)

OTHER PUBLICATIONS

Extended European Search Report issued in related European Application No. 22752210.9, mailed Jul. 2, 2024, 8 pages.
(Continued)

*Primary Examiner* — Ismail A Muse
(74) *Attorney, Agent, or Firm* — IPX PLLC

(57) ABSTRACT

A flexible display module and an electronic device are provided. The flexible display module includes a flexible substrate and a plurality of pixel units. The flexible substrate has a folding region that is provided with a first gap. The first gap extends from a first side surface to a second side surface in a thickness direction of the flexible substrate. A first preset distance is reserved between one end of the first gap and the second side surface of the flexible substrate. The first gap penetrates through the flexible substrate along a lengthwise direction or a width direction of the flexible substrate. A plurality of pixel units are distributed on the first side surface of the flexible substrate at intervals. The pixel units adjacent to the first gap are spaced apart from the first gap.

18 Claims, 5 Drawing Sheets

(51) Int. Cl.

| | | |
|---|---|---|
| *H01L 25/16* | (2023.01) | |
| *H01L 33/00* | (2010.01) | |

(58) Field of Classification Search
CPC ............... H01L 23/5387; H01L 25/167; H01L 25/0753; H10H 20/855; Y02E 10/549
See application file for complete search history.

(56) References Cited

U.S. PATENT DOCUMENTS

| | | | |
|---|---|---|---|
| 2018/0233681 A1 | 8/2018 | Tang | |
| 2019/0131575 A1 | 5/2019 | Peng et al. | |
| 2019/0179470 A1* | 6/2019 | Hong .................. | G09G 3/3275 |
| 2019/0204952 A1 | 7/2019 | Han et al. | |
| 2020/0350506 A1 | 11/2020 | Cho et al. | |
| 2020/0396837 A1* | 12/2020 | Tian ......................... | G09F 9/301 |
| 2023/0056754 A1 | 2/2023 | Zeng et al. | |
| 2024/0257671 A1* | 8/2024 | Yamazaki ................. | G09F 9/30 |

FOREIGN PATENT DOCUMENTS

| | | | |
|---|---|---|---|
| CN | 206400960 U | 8/2017 | |
| CN | 107578707 A | 1/2018 | |
| CN | 108288681 A | 7/2018 | |
| CN | 109273515 A | 1/2019 | |
| CN | 109817680 A | 5/2019 | |
| CN | 110767687 A | 2/2020 | |
| CN | 210955911 U | 7/2020 | |
| CN | 111554637 A | 8/2020 | |
| CN | 112018131 A | 12/2020 | |
| CN | 112071883 A | 12/2020 | |
| CN | 112186023 A | 1/2021 | |
| CN | 112951090 A | 6/2021 | |

OTHER PUBLICATIONS

International Search Report issued in corresponding International Application No. PCT/CN2022/075343, mailed April 8. 2022, 4 pages.

First Office Action issued in related Chinese Application No. 202110175261.7, mailed Jun. 30, 2022, 8 pages.

* cited by examiner

FLEXIBLE DISPLAY MODULE AND ELECTRONIC DEVICE

CROSS-REFERENCE TO RELATED APPLICATIONS

This application is a continuation of International Application No. PCT/CN2022/075343, filed Feb. 7, 2022, which claims priority to Chinese Patent Application No. 202110175261.7, filed Feb. 9, 2021. The entire contents of each of the above-referenced applications are expressly incorporated herein by reference.

TECHNICAL FIELD

This application relates to the technical field of communication devices, and particularly to a flexible display module and an electronic device.

BACKGROUND

With the rapid development of electronic devices, the electronic devices are used in more and more fields. Electronic devices such as a mobile phone and a tablet computer play an increasingly important role in people's work, life, entertainment, and other aspects.

A display module is a main component for realizing a display function of the electronic device. With the continuous improvement of science and technology and increasingly high demands of people, a foldable flexible display module emerges. The existing flexible display module can be folded or stretched. When the flexible display module is folded, the flexible display module has a relatively small volume, and is convenient to carry. When the flexible display module is unfolded, an effective display area of the flexible display module increases, thereby improving the display performance of the electronic device.

In the relevant technology, the flexible display module is formed by stacking and encapsulating a plurality of material layers, and the plurality of material layers are subjected to significant stress, which can easily cause the material layers to crack or drape. As a result, the display performance of the flexible display module is poor.

SUMMARY

The embodiments of this application provide a flexible display module and an electronic device.

The embodiments of this application provide a flexible display module, including:

a flexible substrate, where the flexible substrate has a folding region; the folding region is provided with a first gap; the first gap extends from a first side surface to a second side surface in a thickness direction of the flexible substrate; a first preset distance is reserved between one end of the first gap and the second side surface of the flexible substrate; the first gap penetrates through the flexible substrate along a lengthwise direction or a width direction of the flexible substrate; and a plurality of pixel units, where the plurality of pixel units are distributed on the first side surface of the flexible substrate at intervals, and the pixel units adjacent to the first gap are spaced apart from the first gap.

The embodiments of this application provide an electronic device, including the above flexible display module.

In the embodiments of this application, the flexible substrate has the folding region; the folding region is provided with the first gap; the first gap extends from the first side surface to the second side surface in the thickness direction of the flexible substrate. The pixel units adjacent to the first gap are spaced apart from the first gap. When the flexible display module is folded, the first gap is opened. When the flexible display module is unfolded, the first gap is closed. In this solution, when the flexible display module is folded, the first gap of the flexible substrate is opened, which reduces a pulling stress on the first side surface and an extrusion stress on the second side surface, thereby eliminating some stress that is concentrated in the folding region and causing a relatively low stress on the folding region. Meanwhile, the two adjacent pixel units adjacent to the first gap are separated from the first gap, which reduces the pulling stress and the extrusion stress between the pixel units, thereby reducing a surface stress of the flexible display module in the folded state. Thus, the flexible display module is not easy to crack or drape, making the flexible display module have relatively good display performance.

DETAILED DESCRIPTION

Figure 1:
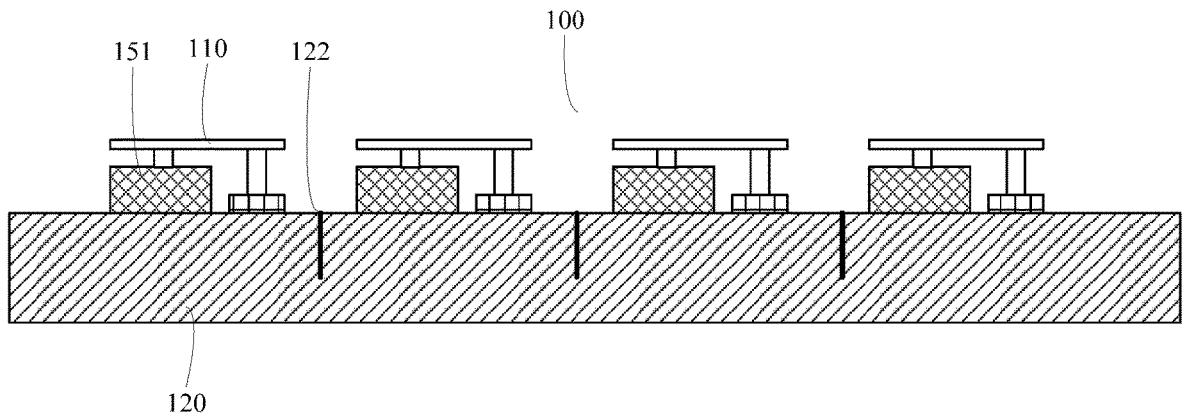
FIG. 1 is a schematic structural diagram of a first kind of flexible display module in an unfolded state according to an embodiment of this application.

The technical solutions in the embodiments of this application are described below with reference to the accompanying drawings in the embodiments of this application. Apparently, the described embodiments are merely some rather than all of the embodiments of this application. All other embodiments obtained by an ordinary person skilled in the art based on the embodiments of this application without making creative efforts shall fall within the protection scope of this application.

This specification and claims of this application, and terms "first" and "second" are used to distinguish similar objects, but are unnecessarily used to describe a specific sequence or order. It is to be understood that such used data is interchangeable where appropriate, so that the embodiments of this application described here can be implemented in an order other than those illustrated or described here. In addition, "and/or" used in this specification and the claims represents at least one of the connected objects. Symbol "/" usually represents an "or" relationship between front and back associated objects.

The flexible display module provided by the embodiments of this application will be described in detail below in conjunction with the accompanying drawings through embodiments and application scenarios thereof.

Referring to FIG. 1 to FIG. 10, the embodiments of this application discloses a flexible display module. The flexible display module 100 disclosed is applied to an electronic device, and can be used for displaying pictures, texts, videos, and other information, thereby realizing a display function of the electronic device. The flexible display module 100 may be folded, so that a display area of the flexible display module 100 can be adjusted, which can improve the use performance of the electronic device. The flexible display module 100 disclosed includes a flexible substrate 120 and a plurality of pixel units 110.

The flexible substrate 120 provide a mounting basis for other components of the flexible display module 100. The flexible substrate 120 has a folding region 121. The flexible substrate 120 can be folded from the folding region 121. The folding region 121 is provided with first gaps 122. The first gap 122 extends from a first side surface to a second side surface in a thickness direction of the flexible substrate 120. A first preset distance is reserved between one end of the first gap 122 and the second side surface of the flexible substrate 120. The first gap 122 penetrates through the flexible substrate 120 along a lengthwise direction or a width direction of the flexible substrate 120.

For example, when the flexible display module 100 is folded along the lengthwise direction, the first gaps 122 penetrate through the flexible substrate 120 along the width direction of the flexible substrate 120. A penetration direction of the first gaps 122 is related to a folding direction of the flexible display module 100. Therefore, the first gaps 122 can be flexibly set according to a specific folding direction of the flexible substrate 120, which is not limited herein. In some embodiments, the flexible substrate 120 may be made of a highly-flexible material such as plastic.

The first gap 122 does not penetrate through the flexible substrate 120 in the thickness direction, ensuring that the flexible substrate 120 on both sides of the first gap 122 is hard to break. The lengthwise direction or the width direction of the flexible substrate 120 penetrates through the flexible substrate 120, so that the flexible substrate 120 is convenient to fold. This setting manner will not affect the connection strength of the flexible substrate 120, so that the flexible substrate 120 is hard to break.

The plurality of pixel units 110 are distributed on the first side surface of the flexible substrate 120 at intervals, and the pixel units 110 adjacent to the first gap 122 are spaced apart from the first gap 122. The pixel unit 110 is the smallest display unit of the flexible display module 100. The pixel unit 110 is used for emitting light to realize a display function of the flexible display module 100.

In an exemplary operation process, when the flexible display module 100 is folded, the first gaps 122 are opened. When the flexible display module 100 is unfolded, the first gaps 122 are closed.

In this solution, when the flexible display module 100 is folded, the first gaps 122 of the flexible substrate 120 are opened, which reduces a pulling stress on the first side surface and an extrusion stress on the second side surface, thereby eliminating some stress that is concentrated in the folding region 121 and causing a relatively low stress on the folding region 121. Meanwhile, the two adjacent pixel units 110 adjacent to the first gap 122 are separated from the first gap 122, which reduces the pulling stress and the extrusion stress between the pixel units 110, thereby reducing a surface stress of the flexible display module 100 in the folded state. Thus, the flexible substrate 120 is not easy to crack or drape, making the flexible display module 100 have relatively good display performance.

In the above embodiment, when the flexible display module is in the unfolded state, the first gaps 122 are closed, which will not affect the normal display function of the flexible display module 100.

In the above embodiment, since two adjacent pixel units 110 adjacent to the first gap 122 need to be separated from the first gap 122, the adjacent pixel units 110 need to be separated from each other. That is, the adjacent pixel units 110 are arranged independently without any connection relationship. Therefore, a pixel layer needs to be cut into a plurality of relatively independent pixel units 110.

In some embodiments, the flexible display module 100 may be a Micro LED (Micro Light Emitting Diode) flexible display module. The pixel units 110 of the Micro LED flexible display module are prepared independently, so that the pixel layer of the flexible display module can be segmented to obtain the plurality of segmented pixel units 110.

Figure 2:
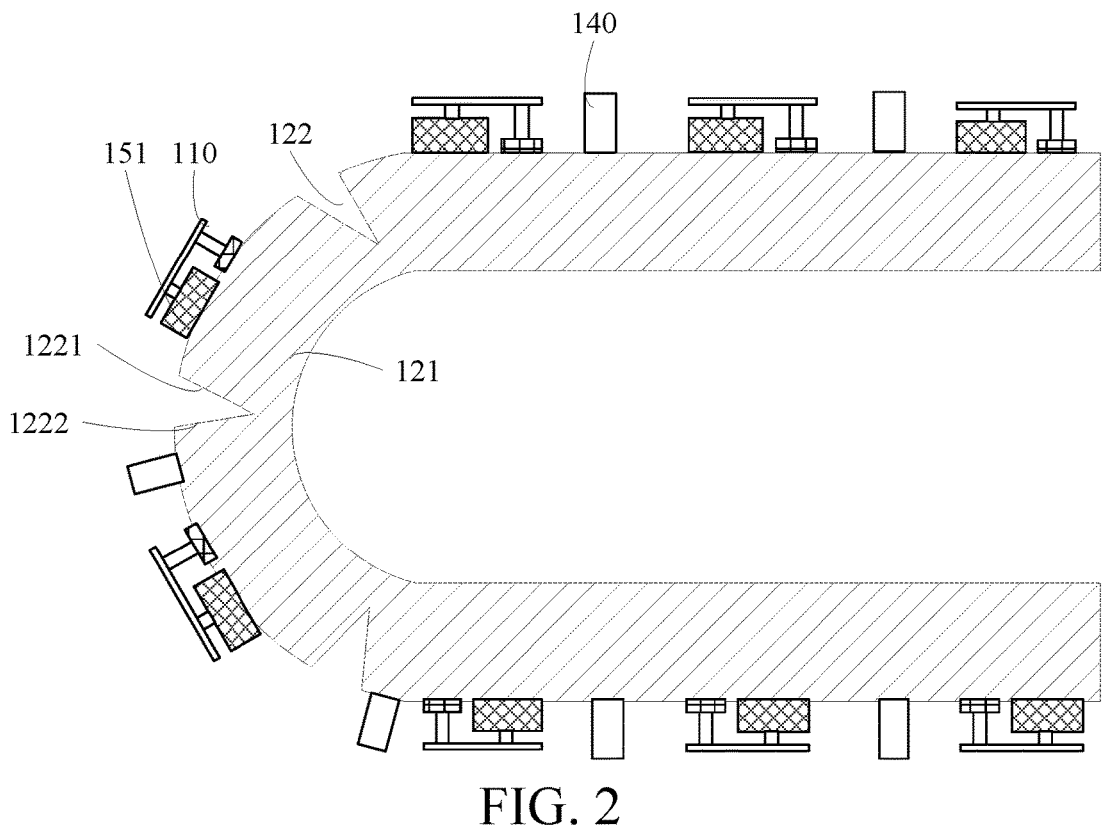
FIG. 2 is a schematic structural diagram of a first kind of flexible display module in a folded state according to an embodiment of this application.
Figure 3:
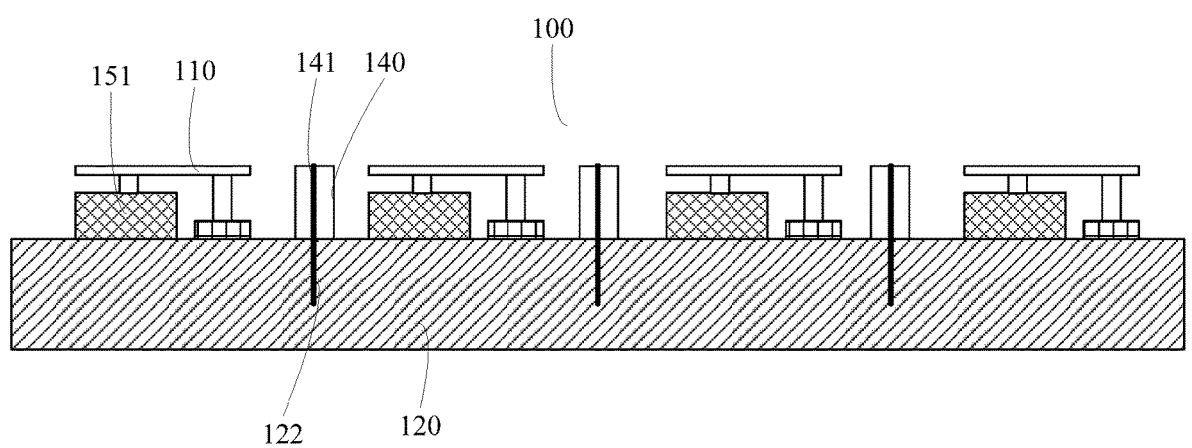
FIG. 3 is a schematic structural diagram of a second kind of flexible display module in an unfolded state according to an embodiment of this application.
Figure 4:
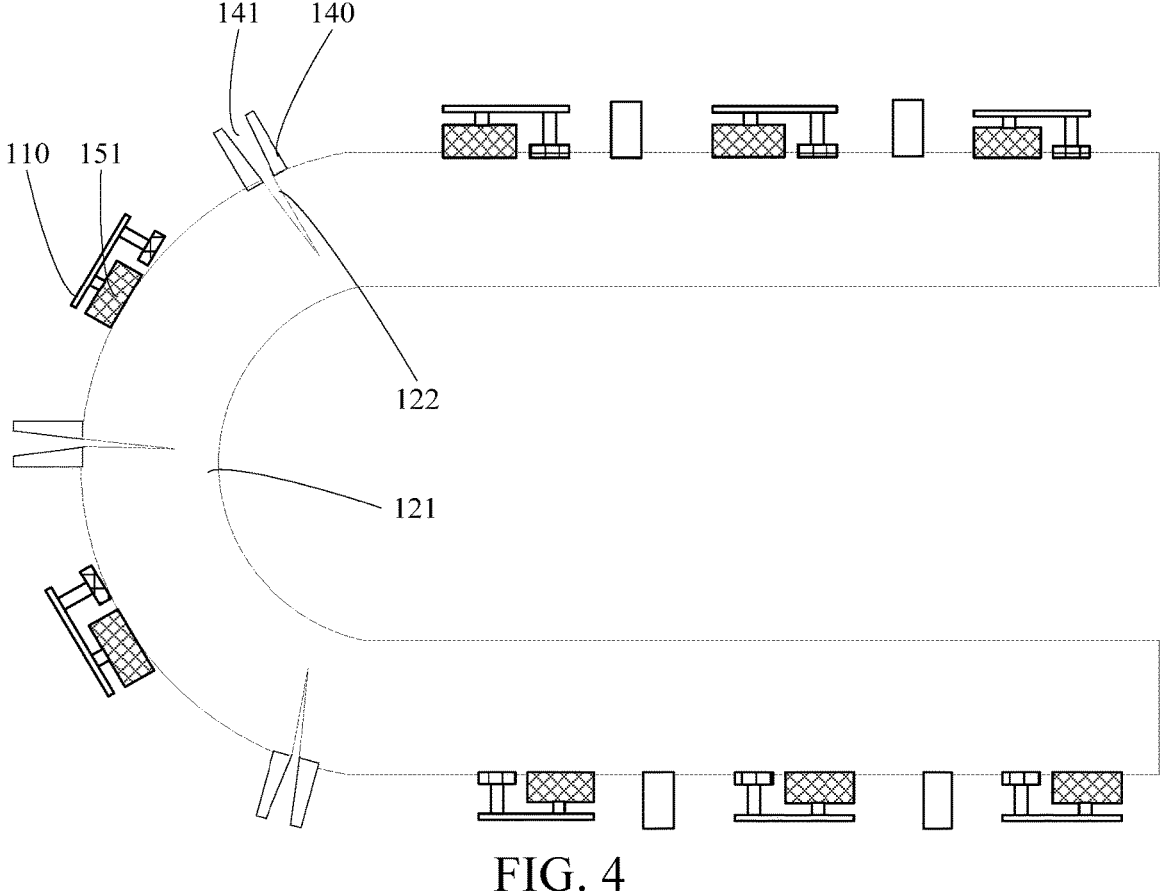
FIG. 4 is a schematic structural diagram of a second kind of flexible display module in a folded state according to an embodiment of this application.
Figure 5:
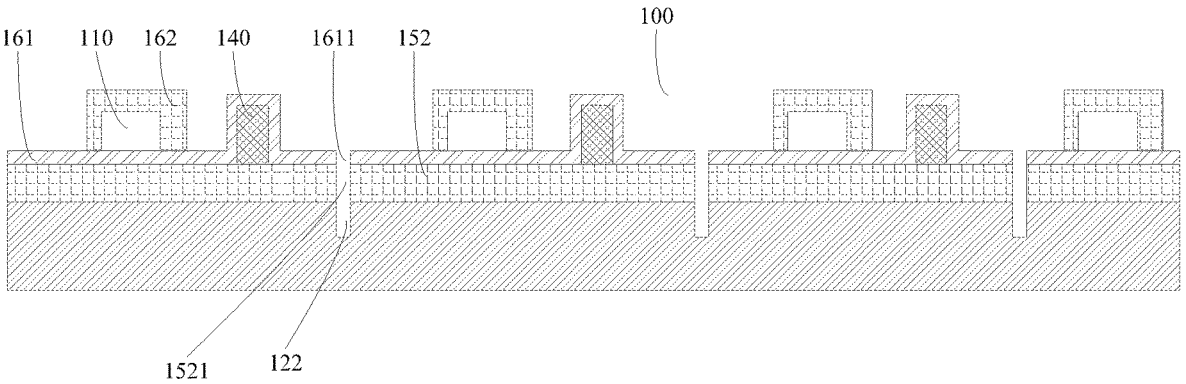
FIG. 5 and FIG. 6 are schematic structural diagrams of a third kind of flexible display module in an unfolded state according to an embodiment of this application.
Figure 6:
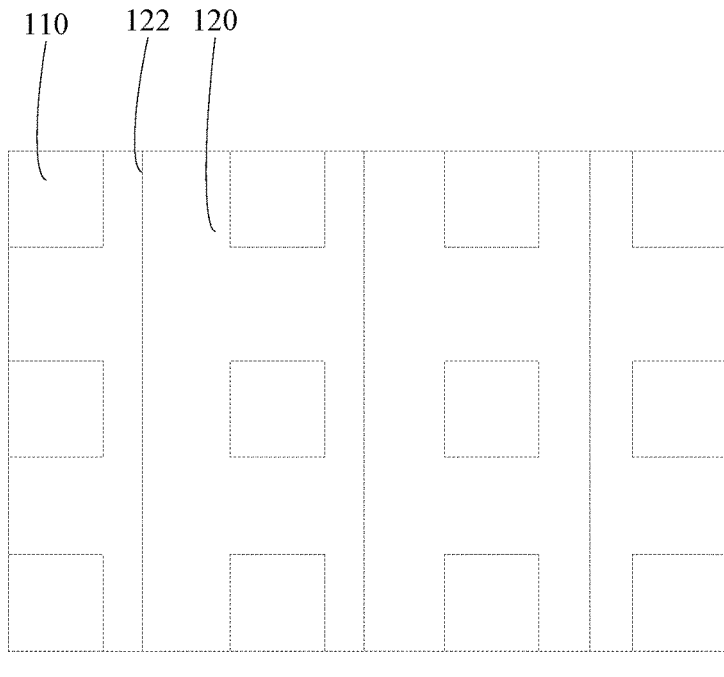
Figure 7:
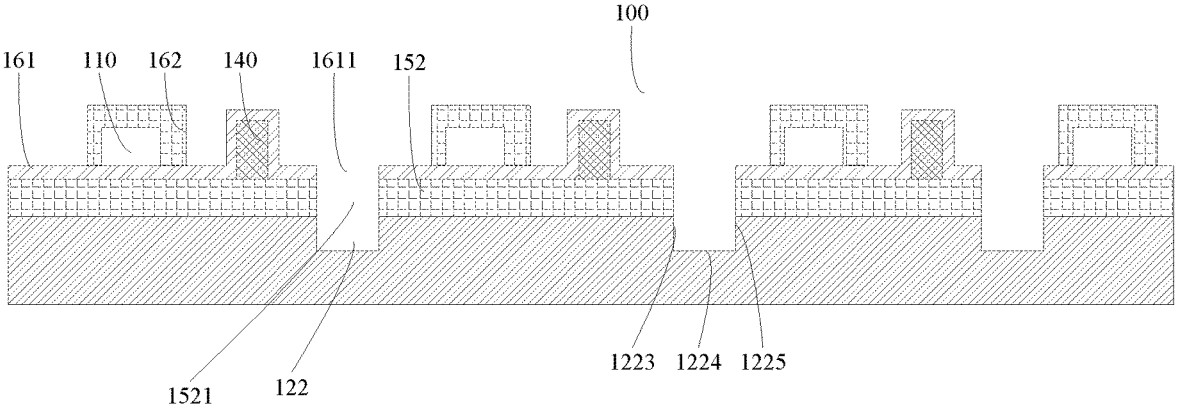
FIG. 7 and FIG. 8 are schematic structural diagrams of a third kind of flexible display module in a folded state according to an embodiment of this application.
Figure 8:
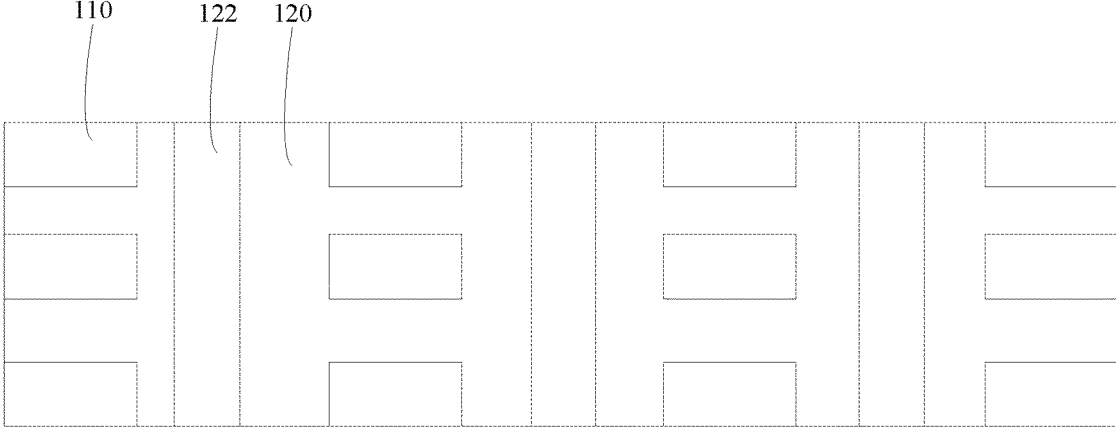

In the above embodiment, the flexible display module 100 may be folded by bending. That is, the flexible display module 100 is bent into two opposite portions, as shown in FIG. 2. Or, the flexible display module 100 may be stretched. That is, the folding region 121 itself has elasticity. When the folding region 121 is subjected to a pulling force, the folding region 121 is stretched, causing the flexible display module 100 to be unfolded. When the pulling force on the flexible display module 100 is removed, the folding region 121 retracts to restore the folded state, as shown in FIG. 5 to FIG. 8. The flexible display module 100 in FIG. 5 and FIG. 6 is in the folded state, so the first gaps 122 are closed. The flexible display module 100 in FIG. 7 and FIG. 8 is in the unfolded state, so the first gaps 122 are opened.

In the above embodiment, the flexible substrate 120 may also include a routing layer 130 in the lengthwise direction or the width direction of the flexible substrate, and the routing layer 130 spans an opening of the first gap 122. At this time, a routing direction of the routing layer 130 is perpendicular to the penetration direction of the first gap. When the flexible substrate 120 is folded, the routing layer 130 is easily tightened, which easily causes the routing layer 130 to be broken.

Based on this, in another embodiment, the routing layer 130 may include a first routing section 131 and a second routing section 132. The first routing section 131 and the second routing section 132 may be at least partially located in the first gap 122. One end of the first routing section 131 located in the first gap 122 may be movably connected to one end of the second routing section 132 located in the first gap 122.

In this solution, the first routing section 131 and the second routing section 132 are movably connected, so when the first gap 122 is opened, the first routing section 131 and the second routing section 132 move in directions away from each other. When the first gap 122 is closed, the first routing section 131 and the second routing section 132 move in directions close to each other. Therefore, positions of the first routing section 131 and the second routing section 132 can be adjusted according to a state of the flexible display module 100, so that the routing layer 130 is hard to break, thereby improving the safety and reliability of the flexible display module 100.

Further, the first routing section 131 and the second routing section 132 may be of coated structures. The first routing section 131 and the second routing section 132 may be both coated on side walls of the first gap 122. In this solution, the coated structures are thinner, so that a width of the first gap 122 can be set smaller, thereby not easily affecting the display effect of the flexible display module 100. At the same time, a processing technology of the coated structures is simple and has low cost. In some embodiments, mask plates are formed on the first side surface and the side walls of the first gap 122 through vacuum sputtering, and circuit patterns are obtained by exposing, etching, and demolding the mask plates.

In some embodiments, one end of the first routing section 131 and one end of the second routing section 132 can be hinged so that the first routing section 131 and the second routing section 132 may rotate relatively in the opening process of the first gap 122.

Figure 9:
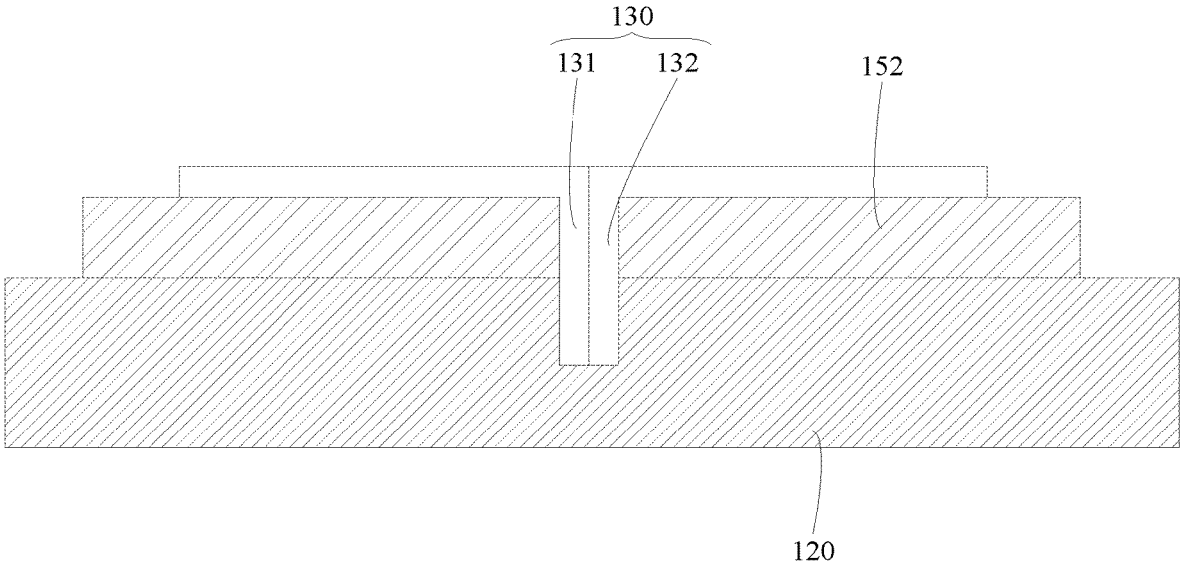
FIG. 9 is a partially enlarged diagram of a flexible display module in a folded state according to an embodiment of this application.
Figure 10:
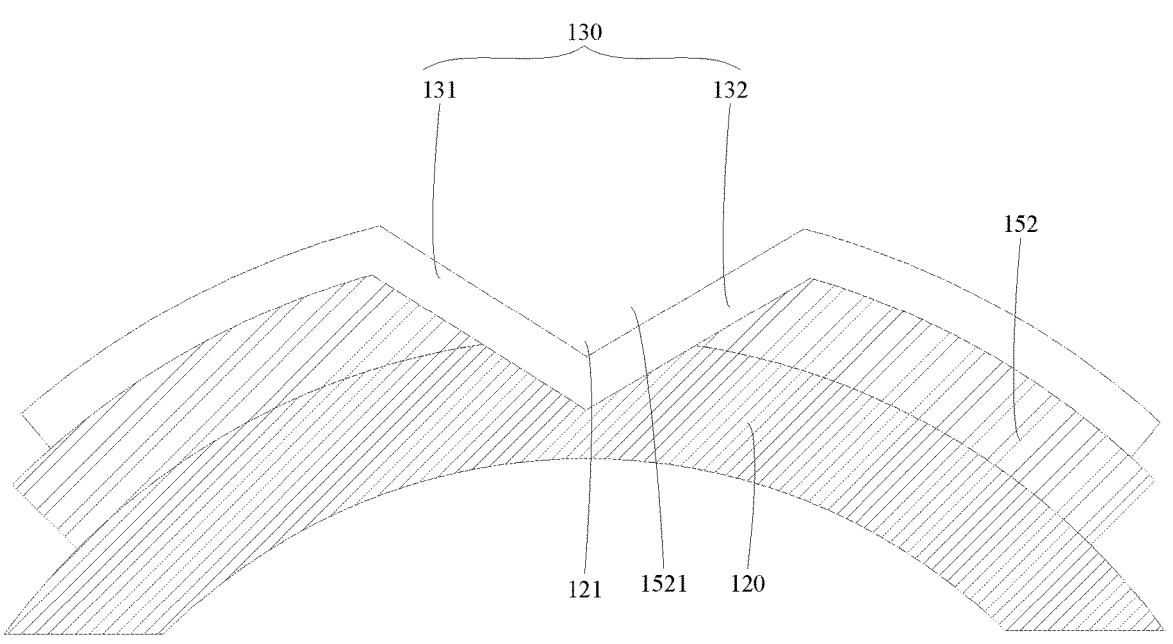
FIG. 10 is a partially enlarged diagram of a flexible display module in an unfolded state according to an embodiment of this application.

In another solution, a portion of the first routing section 131 located inside the first gap 122 may be a first portion, and a portion of the first routing section 131 located outside the first gap 122 is a second portion. A portion of the second routing section 132 located inside the first gap 122 is a third portion, and a portion of the second routing section 132 located outside the first gap 122 is a fourth portion. The first portion, the second portion, the third portion, and the fourth portion mentioned above are for ease of description. When the flexible display module 100 is in the unfolded state, the first portion and the third portion form an integrated electrical connection structure, as shown in FIG. 9. When the flexible display module 100 is in the folded state, the first portion and the third portion are separated, and the first portion and the third portion are respectively two independent electrical connection structures, as shown in FIG. 10.

In some embodiments, when the flexible display module 100 is in the unfolded state, the first gap is filled with the first portion and the third portion.

In order to prevent mutual influence of two adjacent pixel units 110, in another embodiment, the flexible display module disclosed in this application may also include a plurality of separation columns 140. The separation columns 140 may be arranged on the first side surface. At least one separation column 140 may be arranged between two adjacent pixel units 110, and the first gaps 122 may be located between the separation columns 140 and the pixel units 110. In this solution, the separation columns 140 block light emitted by the pixel units 110, which can prevent cross color between two adjacent pixel units and prevent the mutual influence of the pixel units 110, thereby improving the display performance of the flexible display module 100.

In another embodiment, the separation columns 140 may be provided with a second gap 141. The second gap 141 may penetrate through the separation columns 140, and the second gap 141 may be opposite to the first gap 122. This solution can further reduce the stress on the separation columns 140 in the folding region 121, thereby prolonging the service lives of the separation columns 140.

In another embodiment, the flexible display module 100 may also include a plurality of pixel drive units 151. Each of the pixel drive units 151 is electrically connected to one pixel unit 110. The pixel drive units 151 adjacent to the first gap 122 may be spaced apart from the first gap 122. In this solution, each of the pixel drive units 151 controls one pixel unit 110, thereby realizing independent driving for each of the pixel units 110 and improving the display performance of the display module. In addition, two adjacent pixel drive units 151 adjacent to the first gap 122 are separated from the first gap 122, thereby reducing the pulling stress and the extrusion stress between the pixel drive units 151, so that the pixel drive units 151 are hard to damage. Meanwhile, the surface stress of the flexible display module 100 in the folded state is also further reduced.

In some embodiments, the pixel drive unit 151 may be a TFT (Thin Film Transistor), and of course, it may also be of other structures, which is not limited herein.

The pixel drive unit 151 mentioned above is arranged independently. This application further discloses a drive structure of another kind of pixel unit 110. In an embodiment, the flexible display module 100 disclosed in this application may also include a pixel drive layer 152. The pixel drive layer 152 may be arranged between the pixel units 110 and the flexible substrate 120. The plurality of pixel units 110 are electrically connected to the pixel drive layer 152. The pixel drive layer 152 may be provided with a third gap 1521. The third gap 1521 may penetrate through the pixel drive layer 152. The third gap 1521 may be opposite to the first gap 122. At this time, the pixel drive layer 152 is equivalent to an integrated structure formed by integrating the pixel drive units 151 in the above embodiment onto one flexible substrate.

In this solution, the pixel drive layer 152 is superimposed with the flexible substrate 120, which is equivalent to increasing a thickness of the flexible substrate 120, thereby enhancing the strength of the flexible display module 100 and preventing breakage of the flexible display module 100, so as to improve the safety and reliability of the flexible display module 100.

In addition, the pixel drive layer 152 is provided with the third gap 1521 opposite to the first gap 122. Therefore, when the pixel drive layer 152 is folded, the third gaps 1521 can eliminate some stress concentrated on the pixel drive layer 152, so that the flexible display module 100 is hard to crack or drape, which further improves the display performance of the flexible display module.

In the above embodiment, the pixel drive layer 152 and the pixel units 110 may be encapsulated in the same encapsulation layer, but this encapsulation structure leads to poor water oxidation resistance performance of the flexible display module 100, thereby shortening the service life of the flexible display module 100.

Based on this, in another embodiment, the flexible display module 100 disclosed in this application may include a first encapsulation layer 161 and a plurality of second encapsulation layers 162. The first encapsulation layer 161 may be located between the pixel units 110 and the pixel drive layer 152. At this time, the first encapsulation layer 161 may be used for encapsulating the pixel drive layer 152. The first encapsulation layer 161 is provided with a fourth gap 1611. The fourth gap 1611 may penetrate through the first encapsulation layer 161, and the fourth gap 1611 may be opposite to the third gap 1521. Each of the second encapsulation layers 162 encapsulates one pixel unit 110, and each of the first gaps 122 may be located between two adjacent second encapsulation layers 162.

In this solution, the first encapsulation layer 161 is used for encapsulating the pixel drive layer 152, and the second encapsulation layers 162 are used for encapsulating the pixel units 110. Therefore, the pixel drive layer 152 and the pixel units 110 are separately encapsulated, thereby improving the water oxidation resistance performance of the flexible display module 100 and prolonging the service life of the flexible display module 100.

In addition, the first encapsulation layer 161 is provided with the fourth gap 1611 opposite to the third gap 1521, and the third gap 1521 can eliminate some stress concentrated on the first encapsulation layer 161. Meanwhile, each of the first gaps 122 may be located between two adjacent second encapsulation layers 162, so that the two second encapsulation layers 162 are separated from the first gap 122, thereby reducing the pulling stress and the extrusion stress between the second encapsulation layers 162 and further reducing the stress on the flexible display module 100 in the folded state.

In some embodiments, the first encapsulation layer 161 and the second encapsulation layers 162 may be made of synthetic resin. Of course, the first encapsulation layer 161 and the second encapsulation layers 162 may also be made of other materials, which is not limited herein.

In addition, the pixel units 110 need to be electrically connected to the pixel drive layer 152, so an avoidance hole can be formed on the first encapsulation layer 161 to facilitate the electrical connection between the pixel units 110 and the pixel drive layer 152.

In another solution, since each of the pixel units 110 cooperates with one pixel drive unit 151, one pixel unit 110 and one pixel drive unit 151 are encapsulated together.

In some embodiments, when the flexible display module 100 includes the separation columns 140 mentioned above, the first encapsulation layer 161 encapsulates the pixel drive layer 152 and the separation columns 140 together.

The first gap 122 may have various structures. Referring to FIG. 2, the first gap 122 may include a first side wall 1221 and a second side wall 1222 opposite to each other. One side of the first side wall 1221 away from the pixel unit 110 and one side of the second side wall 1222 away from the pixel unit are intersected. At this time, the first gap 122 is of a V-shaped groove structure when the first gap 122 is opened. The first gap 122 is of a linear structure when the first gap 122 is closed.

In this solution, when the flexible display module 100 is in the unfolded state, the first side wall 1221 and the second side wall 1222 may abut against together. Therefore, when the flexible display module 100 is in the unfolded state, the first gap 122 does not easily affect the display performance of the flexible module, thereby making the flexible display module 100 have better display performance in the unfolded state.

As shown in FIG. 5, in some embodiments, the first gap 122 may include a third side wall 1223, a fourth side wall 1224, and a fifth side wall 1225. The third side wall 1223 and the fifth side wall 1225 are opposite to each other, and the fourth side wall 1224 may be arranged between the third side wall 1223 and the fifth side wall 1225, and is connected to the third side wall 1223 and the fifth side wall 1225. At this time, the first gap 122 may be of a rectangular groove structure or trapezoidal groove structure. The first gap 122 has a relatively large size, making it easier for the flexible display module 100 to deform during folding, so that the flexible display module 100 is easier to be folded. In addition, the relatively large size of the first gap 122 can further reduce the stress on the flexible display module 100, thereby further preventing the flexible display module 100 from draping and cracking.

Based on the flexible display module 100 of any one of the above embodiments of this application, the embodiments of this application further disclose an electronic device, the electronic device disclosed includes the flexible display module 100 of any one of the above embodiments.

The electronic device disclosed in the embodiments of this application may be a smartphone, a tablet computer, an e-book reader, a wearable device (such as a smartwatch), an electronic game console, and the like. The embodiments of this application do not limit the specific type of the electronic device.

The embodiments of this application have been described above with reference to the accompanying drawings. This application is not limited to the implementations described above, and the implementations described above are merely exemplary and not limitative. Those ordinary persons skilled in the art may make various forms under the teaching of this application without departing from the spirit of this application and the protection scope of the claims, and these forms shall all fall within the protection of this application.

What is claimed is:

1. A flexible display module, comprising:
   a flexible substrate, wherein the flexible substrate has a folding region, the folding region is provided with a first gap, the first gap extends from a first side surface to a second side surface in a thickness direction of the flexible substrate, a first preset distance is reserved between one end of the first gap and the second side surface of the flexible substrate, the first gap penetrates through the flexible substrate along a lengthwise direction or a width direction of the flexible substrate;
   a plurality of pixel units, wherein the plurality of pixel units are distributed in the folding region on the first side surface of the flexible substrate at intervals, and the pixel units adjacent to the first gap are spaced apart from the first gap; and
   a plurality of pixel drive units on the first side surface of the flexible substrate, wherein each of the pixel drive units is adjacent and electrically connected to a respective pixel unit, and the pixel drive units adjacent to the first gap are spaced apart from the first gap.

2. The flexible display module according to claim 1, wherein the flexible substrate further comprises a routing layer in the lengthwise direction or the width direction of the flexible substrate; the routing layer comprises a first routing section and a second routing section; the first routing section and the second routing section are at least partially located in the first gap; and one end of the first routing section located in the first gap is movably connected to one end of the second routing section located in the first gap.

3. The flexible display module according to claim 2, wherein the first routing section and the second routing section are of coated structures; and both the first routing section and the second routing section are coated on side walls of the first gap.

4. The flexible display module according to claim 1, further comprising a plurality of separation columns, wherein the separation columns are arranged on the first side surface; at least one separation column is arranged between two adjacent pixel units; and the first gap is located between the separation columns and the pixel units.

5. The flexible display module according to claim 1, further comprising a plurality of separation columns, wherein the separation columns are arranged on the first side surface, at least one separation column is arranged between two adjacent pixel units, the separation column is provided with a second gap, the second gap penetrates through the separation column, and the second gap is opposite to the first gap.

6. The flexible display module according to claim 1, further comprising a pixel drive layer, wherein the pixel drive layer is arranged between the pixel units and the flexible substrate, the plurality of pixel units are all electrically connected to the pixel drive layer, the pixel drive layer is provided with a third gap, the third gap penetrates through the pixel drive layer; and the third gap is opposite to the first gap.

7. The flexible display module according to claim 6, comprising a first encapsulation layer and a plurality of second encapsulation layers, wherein the first encapsulation layer is located between the pixel units and the pixel drive layer; the first encapsulation layer is used for encapsulating the pixel drive layer; the first encapsulation layer is provided with a fourth gap; the fourth gap penetrates through the first encapsulation layer; the fourth gap is opposite to the third gap; each of the second encapsulation layers encapsulates one pixel unit; and each of the first gaps is located between two adjacent second encapsulation layers.

8. The flexible display module according to claim 1, wherein the first gap comprises a first side wall and a second side wall opposite to each other; and one side of the first side wall away from each of the pixel units and one side of the second side wall away from each of the pixel units are intersected.

9. The flexible display module according to claim 1, wherein the first gap comprises a third side wall, a fourth side wall, and a fifth side wall; the third side wall and the fifth side wall are opposite to each other; and the fourth side wall is arranged between the third side wall and the fifth side wall and is connected to the third side wall and the fifth side wall.

10. An electronic device, comprising a flexible display module, wherein the flexible display module comprises:

a flexible substrate, wherein the flexible substrate has a folding region, the folding region is provided with a first gap, the first gap extends from a first side surface to a second side surface in a thickness direction of the flexible substrate, a first preset distance is reserved between one end of the first gap and the second side surface of the flexible substrate, the first gap penetrates through the flexible substrate along a lengthwise direction or a width direction of the flexible substrate;

a plurality of pixel units, wherein the plurality of pixel units are distributed in the folding region on the first side surface of the flexible substrate at intervals, and the pixel units adjacent to the first gap are spaced apart from the first gap; and a plurality of pixel drive units on the first side surface of the flexible substrate, wherein each of the pixel drive units is adjacent and electrically connected to a respective pixel unit, and the pixel drive units adjacent to the first gap are spaced apart from the first gap.

11. The electronic device according to claim 10, wherein the flexible substrate further comprises a routing layer in the lengthwise direction or the width direction of the flexible substrate, the routing layer comprises a first routing section and a second routing section, the first routing section and the second routing section are at least partially located in the first gap, and one end of the first routing section located in the first gap is movably connected to one end of the second routing section located in the first gap.

12. The electronic device according to claim 11, wherein the first routing section and the second routing section are of coated structures, and both the first routing section and the second routing section are coated on side walls of the first gap.

13. The electronic device according to claim 10, further comprising a plurality of separation columns, wherein the separation columns are arranged on the first side surface, at least one separation column is arranged between two adjacent pixel units, and the first gap is located between the separation columns and the pixel units.

14. The electronic device according to claim 10, further comprising a plurality of separation columns, wherein the separation columns are arranged on the first side surface, at least one separation column is arranged between two adjacent pixel units, the separation column is provided with a second gap, the second gap penetrates through the separation column, and the second gap is opposite to the first gap.

15. The electronic device according to claim 10, further comprising a pixel drive layer, wherein the pixel drive layer is arranged between the pixel units and the flexible substrate, the plurality of pixel units are all electrically connected to the pixel drive layer, the pixel drive layer is provided with a third gap, the third gap penetrates through the pixel drive layer; and the third gap is opposite to the first gap.

16. The electronic device according to claim 15, comprising a first encapsulation layer and a plurality of second encapsulation layers, wherein the first encapsulation layer is located between the pixel units and the pixel drive layer; the first encapsulation layer is used for encapsulating the pixel drive layer; the first encapsulation layer is provided with a fourth gap; the fourth gap penetrates through the first encapsulation layer; the fourth gap is opposite to the third gap; each of the second encapsulation layers encapsulates one pixel unit; and each of the first gaps is located between two adjacent second encapsulation layers.

17. The electronic device according to claim 10, wherein the first gap comprises a first side wall and a second side wall opposite to each other; and one side of the first side wall away from each of the pixel units and one side of the second side wall away from each of the pixel units are intersected.

18. The electronic device according to claim 10, wherein the first gap comprises a third side wall, a fourth side wall, and a fifth side wall; the third side wall and the fifth side wall are opposite to each other; and the fourth side wall is arranged between the third side wall and the fifth side wall and is connected to the third side wall and the fifth side wall.

* * * * *